(12) United States Patent
Okada et al.

(10) Patent No.: US 9,263,269 B2
(45) Date of Patent: Feb. 16, 2016

(54) REACTION TUBE, SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventors: Satoshi Okada, Toyama (JP); Kosuke Takagi, Toyama (JP); Yukinao Kaga, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 6 days.

(21) Appl. No.: 14/025,710

(22) Filed: Sep. 12, 2013

(65) Prior Publication Data
US 2014/0073146 A1 Mar. 13, 2014

(30) Foreign Application Priority Data

Sep. 13, 2012 (JP) .................................. 2012-201429

(51) Int. Cl.
| | | |
|---|---|---|
| H01L 21/00 | (2006.01) |
| H01L 21/263 | (2006.01) |
| C23C 16/34 | (2006.01) |
| C23C 16/40 | (2006.01) |
| C23C 16/455 | (2006.01) |

(52) U.S. Cl.
CPC .............. *H01L 21/263* (2013.01); *C23C 16/34* (2013.01); *C23C 16/402* (2013.01); *C23C 16/45542* (2013.01); *C23C 16/45546* (2013.01)

(58) Field of Classification Search
CPC ................................................ H01L 21/67303

USPC .......................................................... 438/798
See application file for complete search history.

(56) References Cited

U.S. PATENT DOCUMENTS

| | | | |
|---|---|---|---|
| 2,213,161 A * | 8/1940 | Ericsson ....................... 220/582 |
| 2009/0250005 A1* | 10/2009 | Kaneko et al. ................. 118/724 |
| 2011/0065283 A1* | 3/2011 | Sato et al. ...................... 438/758 |
| 2011/0223693 A1* | 9/2011 | Sugishita ........................... 438/5 |

FOREIGN PATENT DOCUMENTS

| | | |
|---|---|---|
| JP | 2010-147432 | 7/2010 |
| JP | 2011-052319 | 3/2011 |

OTHER PUBLICATIONS

National Institute of Health, Prudent Practices in the Laboratory: Handling and Management of Chemical Hazards: Updated Version, Copyright 2011.*

* cited by examiner

*Primary Examiner* — Reema Patel
*Assistant Examiner* — Syed Gheyas
(74) *Attorney, Agent, or Firm* — Edell, Shapiro & Finnan LLC

(57) ABSTRACT

Provided are a reaction tube, a substrate processing apparatus, and a method of manufacturing a semiconductor device capable of suppressing a non-uniform distribution of a gas in a top region to improve the flow of the gas and film uniformity within and between substrate surfaces. The reaction tube has a cylindrical shape, accommodates a plurality of substrates stacked therein, and includes a cylindrical portion and a ceiling portion covering an upper end portion of the cylindrical portion, the ceiling portion having a substantially flat top inner surface. A thickness of a sidewall of the ceiling portion is greater than that of a sidewall of the cylindrical portion.

13 Claims, 11 Drawing Sheets

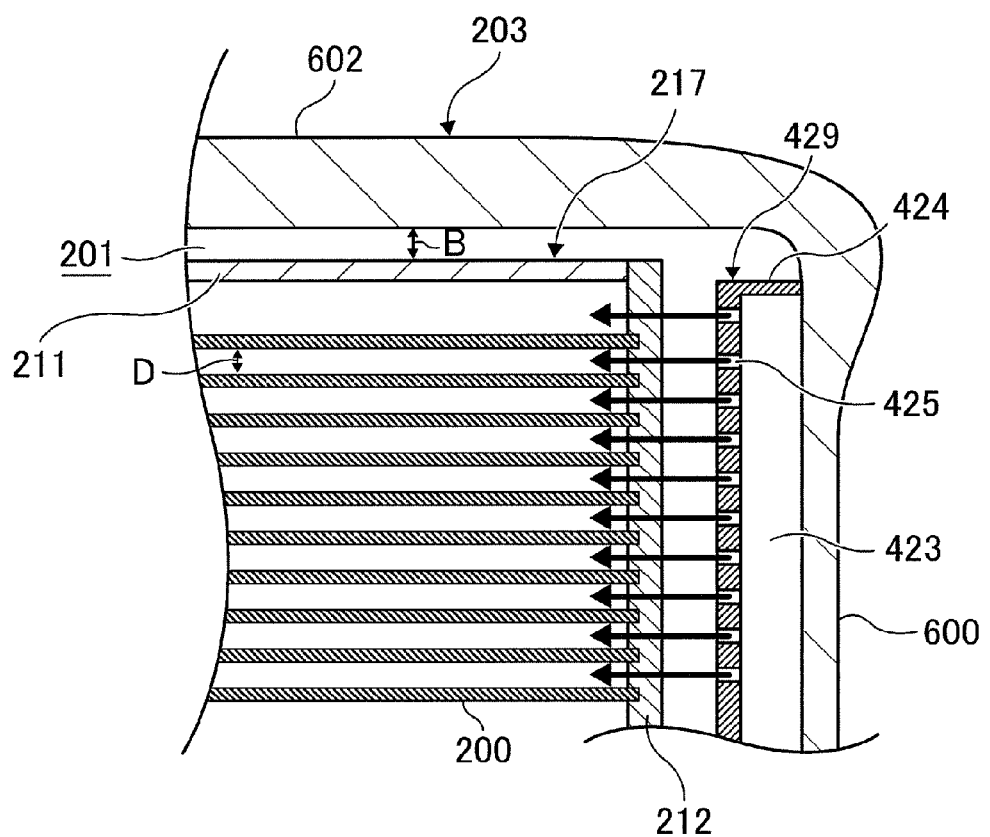

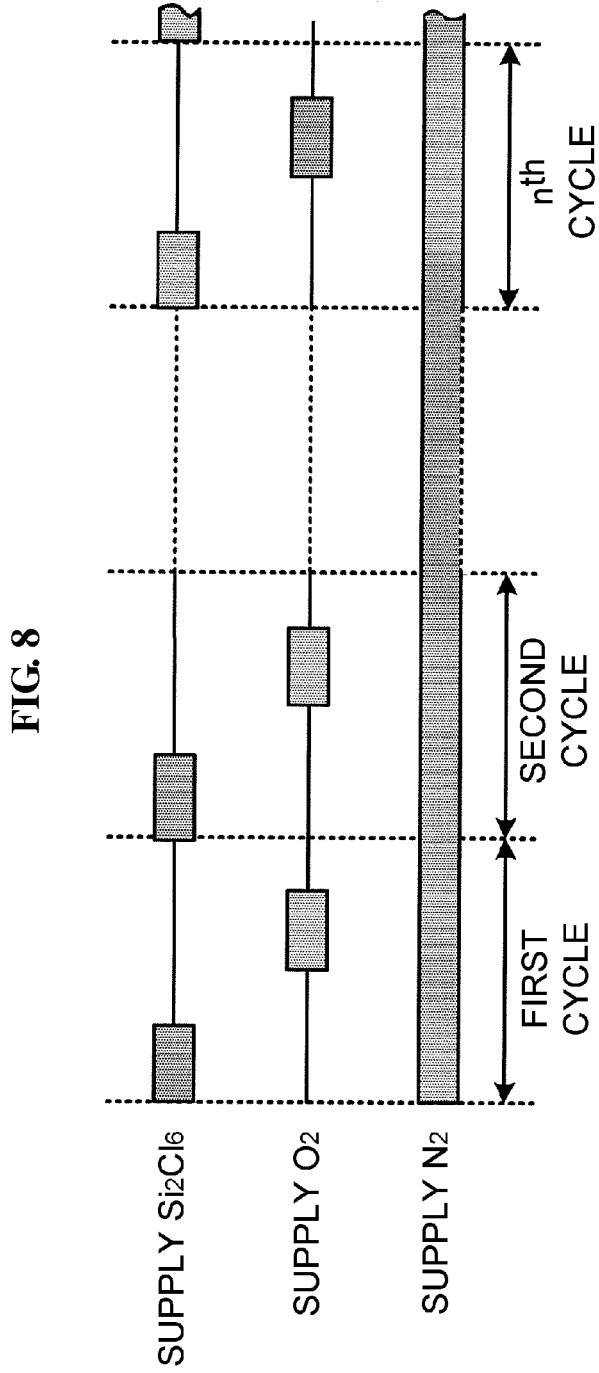

<PRIOR ART>

<PRIOR ART>

REACTION TUBE, SUBSTRATE PROCESSING APPARATUS AND METHOD OF MANUFACTURING SEMICONDUCTOR DEVICE

CROSS REFERENCE TO RELATED APPLICATIONS

This application claims foreign priority under 35 U.S.C. §119(a)-(d) to Application No. JP 2012-201429 filed on Sep. 13, 2012, entitled "Reaction Tube, Substrate Processing Apparatus and Method of Manufacturing Semiconductor Device," the entire contents of which are hereby incorporated by reference.

FIELD OF THE INVENTION

The present invention relates to a reaction tube configured to process a substrate, a substrate processing apparatus, and a method of manufacturing a semiconductor device.

BACKGROUND

An example of a substrate processing apparatus includes a semiconductor manufacturing device, and a longitudinal apparatus has been known as an example of a semiconductor manufacturing device. In the example of the substrate processing apparatus, a boat is included as a substrate retaining member configured to retain substrates (wafers) in a reaction tube in a multi-stage manner, and the substrates are processed in a process chamber in the reaction tube in a state in which the plurality of substrates are retained on the boat.

Japanese Unexamined Patent Application Publication No. 2011-52319 discloses that a plurality of wafers 200 which are to be processed in a batch are inserted into a reaction tube 203 while the plurality of wafers 200 are stacked on a boat 217 in a multi-stage manner, at least two types of sources are simultaneously supplied into the reaction tube 203, and a film is formed on the wafers 200 placed in the reaction tube 203.

However, as illustrated in FIG. 9A, since an upper tubular portion of a conventional reaction tube 203 is dome-shaped, a large space is formed between an upper internal surface of the reaction tube 203 and a ceiling plate 211 formed on the top of the boat 217. Thus, in an upper region in the reaction tube 203 (hereinafter referred to as a 'top region'), a gas is supplied into a process chamber 201 via gas supply holes formed in a nozzle 710. Then, the gas flows upward in the reaction tube 203 and is then exhausted via an exhaust pipe in a low portion of the reaction tube 203. A part of the gas flowing upward in the reaction tube 203 is stagnant in the top region, thereby causing a non-uniform distribution of the gas in the top region. Also, as illustrated in FIG. 9B, when the reaction tube 203 having plasma generation structures 429 is used, a buffer chamber 423 is installed in the reaction tube 203 and a gas is thus likely to stagnate in an upper space in a buffer chamber wall 424 forming the buffer chamber 423, thereby causing a non-uniform distribution of the gas in the top region.

SUMMARY

It is an object of the present invention to provide a reaction tube, a substrate processing apparatus and a semiconductor device manufacturing method capable of enhancing uniformity of gas distribution in a top region to improve the flow of the gas as well as film uniformity within and between substrate surfaces,.

According to one aspect of the present invention, there is provided a reaction tube having a cylindrical shape and accommodating a plurality of substrates stacked therein, the reaction tube including: a cylindrical portion; and a ceiling portion covering an upper end portion of the cylindrical portion and having a substantially flat top inner surface, wherein a thickness of a sidewall of the ceiling portion is greater than that of a sidewall of the cylindrical portion.

According to another aspect of the present invention, there is provided substrate processing apparatus including: a reaction tube having a cylindrical shape and accommodating a plurality of substrates stacked therein, the reaction tube including: a process chamber configured to process the plurality of substrates in the reaction tube; a cylindrical portion; and a ceiling portion covering an upper portion of the cylindrical portion and having a substantially flat top inner surface, a thickness of a sidewall of the ceiling portion being greater than that of a sidewall of the cylindrical portion; a process gas supply system including a nozzle disposed in the process chamber along a stacking direction of the plurality of substrates, and configured to supply a process gas into the process chamber via the nozzle; and a control unit configured to control the process gas supply system to supply the process gas into the process chamber so as to process the plurality of substrates.

According to another aspect of the present invention, there is provided a substrate processing apparatus including: a reaction tube having a cylindrical shape and accommodating a plurality of substrates stacked therein, the reaction tube including a process chamber configured to process the plurality of substrates in the reaction tube, and a buffer chamber partitioned from the process chamber; a process gas supply system configured to supply a process gas into the buffer chamber; a plasma generator including an electrode in the buffer chamber; and a control unit configured to control the process gas supply system and the plasma generator to process the plurality of substrates by plasma-exciting the process gas and supplying the plasma-excited process gas into the process chamber by applying a voltage to the electrode. The reaction tube includes a cylindrical portion; and a ceiling portion covering an upper end portion of the cylindrical portion and having a substantially flat top inner surface. A thickness of a sidewall of the ceiling portion is greater than that of a sidewall of the cylindrical portion.

According to another aspect of the present invention, there is provided a method of manufacturing a semiconductor device, the method including: (a) loading a plurality of substrates into a reaction tube, the reaction tube including a cylindrical portion and a ceiling portion covering an upper end portion of the cylindrical portion wherein the ceiling portion has a substantially flat top inner surface, and a thickness of a sidewall of the ceiling portion being greater than that of a sidewall of the cylindrical portion; (b) processing the plurality of substrates by supplying a process gas into the reaction tube; and (c) unloading the plurality of substrates from the reaction tube.

BRIEF DESCRIPTION OF THE DRAWINGS

FIGS. 4A and 4B are diagrams illustrating the flow of a gas in a top region of a reaction tube, in which FIG. 4A is a cross-sectional view of a reaction tube according to an embodiment of the present invention and FIG. 4B is a cross-sectional view of a reaction tube according to a comparative example of the present invention.

FIG. 8 is a timing chart illustrating a sequence of a film-forming process according to the second embodiment of the present invention.

FIGS. 9A and 9B are diagrams illustrating the flow of a gas in a top region of a conventional reaction tube, in which FIG. 9A is a cross-sectional view illustrating a case in which a nozzle is used and FIG. 9B is a cross-sectional view illustrating a case in which a plasma generation mechanism is used.

DETAILED DESCRIPTION

Hereinafter, exemplary embodiments of the present invention will be described with reference to the accompanying drawings.

Figure 1:
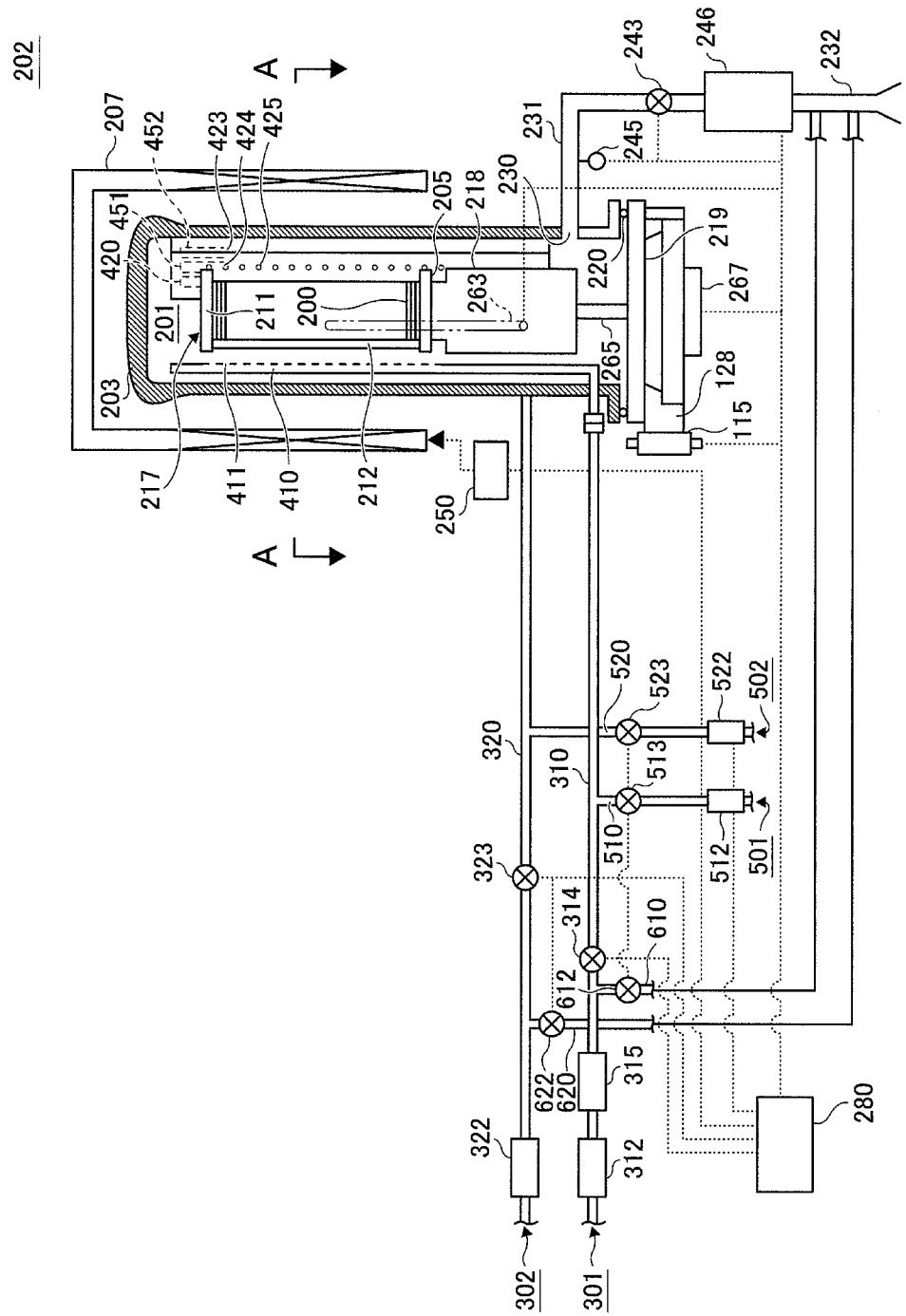
FIG. 1 is a schematic configuration diagram of an example of a process furnace according to an embodiment of the present invention, and members annexed thereto, in which a longitudinal cross-sectional view of a portion of the process furnace is illustrated.
Figure 2:
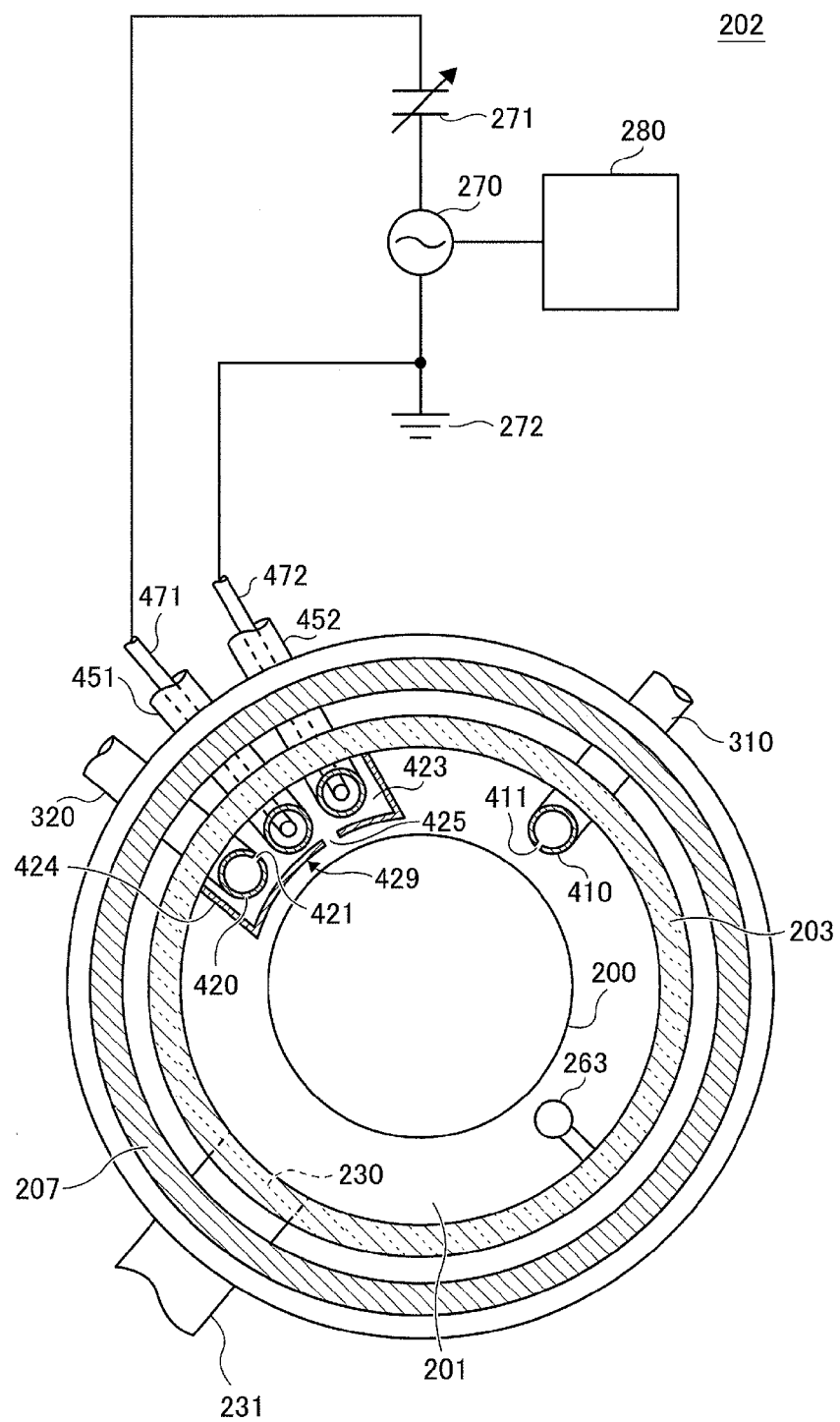
FIG. 2 is a cross-sectional view of the process furnace according to an embodiment of the present invention, taken along line A-A of FIG. 1.

FIG. 1 is a schematic configuration diagram of a longitudinal process furnace 202 of a substrate processing apparatus according to an embodiment of the present invention, in which a longitudinal cross-sectional view of a portion of the process furnace 202 is schematically illustrated. FIG. 2 is a cross-sectional view of the longitudinal process furnace 202 of the substrate processing apparatus according to an embodiment of the present invention, in which a transverse cross-section of a portion of the process furnace 202 is illustrated. The substrate processing apparatus is configured as an example of a semiconductor manufacturing device to be used to manufacture a semiconductor device As illustrated in FIGS. 1 and 2, a heater 207 serving as a heating device (heating member) configured to heat a wafer 200 is installed in the process furnace 202. The heater 207 includes an insulating member having a cylindrical shape, the top end of which is closed, and a plurality of heater wires. The heater 207 has a unit configuration in which the heat wires are installed with respect to the insulating member. A reaction tube 203 configured to process the wafer 200 and formed of quartz is installed in the heater 207 to be concentrically formed with the heater 207.

A seal cap 219 serving as a furnace port lid is installed below the reaction tube 203 to air-tightly seal a low end opening in the reaction tube 203. The seal cap 219 abuts a lower end of the reaction tube 203 from a lower side in a vertical direction. The seal cap 219 is formed of a metal such as stainless steel, and has a disk shape. A sealing member 220 (hereinafter referred to as an 'O-ring') is disposed between a ring-shaped flange installed at a lower opening end of the reaction tube 203 and a top surface of the seal cap 219, and a space between the ring-shaped flange and the top surface of the seal cap 219 is air-tightly sealed. A process chamber 201 is formed by at least the reaction tube 203 and the seal cap 219.

On the seal cap 219, a boat support platform 218 is installed to support a boat 217. The boat support platform 218 is formed of, for example, a heat-resistant material such as quartz or silicon carbide, and is a support body that not only functions as an insulating unit but also supports the boat 217. The boat 217 is installed on the boat support platform 218. The boat 217 is formed of, for example, a heat-resistant material such as quartz or silicon carbide. The boat 217 includes a lower plate 205 fixed on the boat support platform 218 and a ceiling plate 211 disposed above the lower plate 205, and has a configuration in which a plurality of pillars 212 are installed between the lower plate 205 and the ceiling plate 211. A plurality of wafers 200 are retained on the boat 217. The plurality of wafers 200 are arranged at predetermined intervals and in a horizontal posture, and are supported by the plurality of pillars 212 of the boat 217 in a state in which the plurality of wafers 200 are concentrically aligned and stacked in a multi-stage manner in a tube axial direction of the reaction tube 203.

A boat rotation mechanism 267 configured to rotate the boat 217 is installed at a side opposite to a side of the process chamber 201 of the seal cap 219. A rotary shaft 265 of the boat rotation mechanism 267 is connected to the boat support platform 218 while passing through the seal cap 219. The boat rotation mechanism 267 rotates the wafers 200 by rotating the boat 217 via the boat support platform 218.

The seal cap 219 is vertically moved by a boat elevator 115 which is a lifting mechanism installed outside the reaction tube 203. By vertically moving the seal cap 219, the boat 217 may be loaded into/unloaded from the process chamber 201.

The boat 217 is inserted into the process chamber 201 while being supported by the boat support platform 218, in a state in which the plurality of wafers 200 processed in a batch in the process furnace 202 described above are stacked on the boat 217 in a multi-stage manner, and the heater 207 heats the wafers 200 inserted into the process chamber 201 to a predetermined temperature.

Referring to FIGS. 1 and 2, two gas supply pipes 310 and 320 are provided to supply a source gas.

In the process chamber 201, nozzles 410 and 420 are installed. The nozzles 410 and 420 are installed while passing through a lower portion of the reaction tube 203. The gas supply pipe 310 is connected to the nozzle 410 and the gas supply pipe 320 is connected to the nozzle 420.

At the gas supply pipe 310, a mass flow controller 312 which is a flow rate control device (flow rate control member), a vaporizer 315 which is a vaporizing unit (vaporizing member), and a valve 314 which is an opening/closing valve are sequentially installed, starting from an upstream side.

An end of the gas supply pipe 310 at a downstream side is connected to an end of the nozzle 410. The nozzle 410 is installed in an arc-shaped space between an inner wall of the reaction tube 203 and the wafers 200 to move from a lower portion of the inner wall of the reaction tube 203 upward along an upper portion of the inner wall of the reaction tube 203 in a direction in which the wafers 200 are stacked. The nozzle 410 is configured as an L-shaped long nozzle. At a side of the nozzle 410, a plurality of gas supply holes 411 are installed to supply the source gas. The plurality of gas supply holes 411 are open toward the center of the reaction tube 203. The plurality of gas supply holes 411 are installed at the same pitch, wherein the areas of the gas supply holes 411 are equal, or increase or decrease gradually from the bottom to the top.

Also, at the gas supply pipe 310, a vent line 610 and a valve 612 connected to an exhaust pipe 232 (which will be described below) are installed between the vaporizer 315 and the valve 314. When the source gas is not supplied into the process chamber 201, the source gas is supplied to the vent line 610 via the valve 612.

A first gas supply system 301 (source gas supply system) mainly includes the gas supply pipe 310, the mass flow controller 312, the vaporizer 315, the valve 314, the nozzle 410, the vent line 610, and the valve 612.

Also, a carrier gas supply pipe 510 configured to supply a carrier gas (inert gas) is connected to the gas supply pipe 310 at a downstream side of the valve 314. A mass flow controller 512 and a valve 513 are installed at the carrier gas supply pipe 510. A first carrier gas supply system 501 (first inert gas supply system) mainly includes the carrier gas supply pipe 510, the mass flow controller 512, and the valve 513.

A mass flow controller 322 which is a flow rate control device (flow rate control member) and a valve 323 which is an opening/closing valve are sequentially installed at the gas supply pipe 320, starting from an upstream side.

An end of the gas supply pipe 320 at a downstream side is connected to an end of the nozzle 420. The nozzle 420 is installed in the buffer chamber 423 which is a gas dispersion space (discharging chamber/space). In the buffer chamber 423, electrode protection pipes 451 and 452 which will be described below are further installed. The nozzle 420, the electrode protection pipe 451, and the electrode protection pipe 452 are sequentially disposed in the buffer chamber 423.

The buffer chamber 423 is formed by the inner wall of the reaction tube 203 and the buffer chamber wall 424. The buffer chamber wall 424 is installed in a region ranging from the bottom to the top of the inner wall of the reaction tube 203, in an arc-shaped space between the inner wall of the reaction tube 203 and the wafers 200, in the direction in which the wafers 200 are stacked. A plurality of gas supply holes 425 are installed in a wall of the buffer chamber wall 424 adjacent to the wafers 200. The gas supply holes 425 are installed between the electrode protection pipes 451 and 452. The gas supply holes 425 are open toward the center of the reaction tube 203. The gas supply holes 425 are installed from the bottom to the top of the reaction tube 203, each have the same opening area, and are installed at the same pitch.

The nozzle 420 is installed at one end of the buffer chamber 423 to move upward from the bottom to the top of the inner wall of the reaction tube 203 in the direction in which the wafers 200 are stacked. The nozzle 420 is configured as an L-shaped long nozzle. A plurality of gas supply holes 421 are installed at a side surface of the nozzle 420 to supply a gas. The gas supply holes 421 are open toward the center of the buffer chamber 423. The gas supply holes 421 are installed from the bottom to the top of the reaction tube 203, similar to the gas supply holes 425 of the buffer chamber 423. The opening areas and pitches of the plurality of respective gas supply holes 421 may be the same from an upstream side (the bottom) to a downstream side (the top) when the difference between the pressures in the buffer chamber 423 and the nozzle 420 is small. However, the opening areas of the plurality of respective gas supply holes 421 may become larger or the opening pitches of the plurality of respective gas supply holes 421 may become smaller from the upstream side to the downstream side when the difference between the pressures in the buffer chamber 423 and the nozzle 420 is large.

In the present embodiment, gases having different flow velocities but substantially the same flow rate are discharged from the respective gas supply holes 421 by adjusting the opening areas or pitches of the respective gas supply holes 421 of the nozzle 420 from the upstream side to the downstream side as described above. Also, the gases discharged from the respective gas supply holes 421 are first introduced into the buffer chamber 423, and the different flow velocities of the gases are equalized in the buffer chamber 423.

In other words, the speeds of particles of the gases discharged from the respective gas supply holes 421 of the nozzle 420 into the buffer chamber 423 are slowed down in the buffer chamber 423, and the gases are then discharged into the process chamber 201 from the respective gas supply holes 425 of the buffer chamber 423. Thus, the flow rates and velocities of the gases discharged into the buffer chamber 423 from the respective gas supply holes 421 of the nozzle 420 are equalized when the gases are discharged from the respective gas supply holes 425 of the buffer chamber 423 into the process chamber 201.

Also, at the gas supply pipe 320, a vent line 620 and a valve 622 connected to the exhaust pipe 232 (which will be described below) are installed between the valve 323 and the mass flow controller 322.

A second gas supply system 302 (modifying gas supply system/reactive gas supply system) mainly includes the gas supply pipe 320, the mass flow controller 322, the valve 323, the nozzle 420, the buffer chamber 423, the vent line 620, and the valve 622.

Also, a carrier gas supply pipe 520 configured to supply a carrier gas (inert gas) is connected to the gas supply pipe 320 at a downstream side of the valve 323. A mass flow controller 522 and a valve 523 are installed at the carrier gas supply pipe 520. A second carrier gas supply system 502 (second inert gas supply system) mainly includes the carrier gas supply pipe 520, the mass flow controller 522, and the valve 523.

The flow rate of a gaseous source gas is adjusted by the mass flow controller 322, and the adjusted gaseous source gas is supplied to the gas supply pipe 320.

When a source gas is not supplied into the process chamber 201, the valve 323 is closed, the valve 622 is opened, and the source gas is supplied to the vent line 620 via the valve 622 beforehand.

In order to supply the source gas into the process chamber 201, the valve 622 is closed, the valve 323 is opened, and the source gas is supplied to the gas supply pipe 320 at the downstream side of the valve 323. Meanwhile, the flow rate of a carrier gas is adjusted by the mass flow controller 522 and the adjusted carrier gas is then supplied from the carrier gas supply pipe 520 via the valve 523. The source gas is mixed with the adjusted carrier gas at the downstream side of the valve 323, and the mixture gas is supplied into the process chamber 201 via the nozzle 420 and the buffer chamber 423.

In the buffer chamber 423, a rod-shaped electrode 471 and a rod-shaped electrode 472 which are slender and long electrodes are provided from the bottom of the reaction tube 203 to the top thereof, in the direction in which the wafers 200 are stacked. The rod-shaped electrodes 471 and 472 are disposed in parallel with the nozzle 420. The rod-shaped electrodes 471 and 472 are covered with the electrode protection pipes 451 and 452, respectively, which are configured to protect these electrodes from the top to the bottom. The rod-shaped electrode 471 is connected to a radio-frequency (RF) power source 270 via an impedance matching unit 271, and the rod-shaped electrode 472 is connected to an earth 272 that is a reference electric potential. Thus, plasma is generated in a plasma generating region between the rod-shaped electrode 471 and the rod-shaped electrode 472. The plasma generation structures 429 mainly includes the rod-shaped electrode 471, the rod-shaped electrode 472, the electrode protection pipe 451, the electrode protection pipe 452, the buffer chamber 423, and the gas supply holes 425. A first plasma source serving as a plasma generator (plasma generation unit) mainly includes the rod-shaped electrode 471, the rod-shaped electrode 472, the electrode protection pipe 451, the electrode protection pipe 452, the impedance matching unit 271, and the RF power source 270. The first plasma source functions as an activation mechanism configured to activate a gas using plasma. The buffer chamber 423 functions as a plasma generation chamber.

The electrode protection pipes 451 and 452 are inserted into the buffer chamber 423 at a location having the same height as the vicinity of a lower portion of the boat support platform 218 via through-holes (not shown) formed in the reaction tube 203.

The electrode protection pipes 451 and 452 are configured to be inserted into the buffer chamber 423 in a state in which the rod-shaped electrodes 471 and 472 are isolated from an atmosphere in the buffer chamber 423. When the insides of the electrode protection pipes 451 and 452 have the same atmosphere as external air (air), the rod-shaped electrodes 471 and 472 inserted into the respective electrode protection pipes 451 and 452 are oxidized by the heat generated by the heater 207. Thus, an inert gas purging mechanism (not shown) is installed in the electrode protection pipes 451 and 452 to prevent oxidation of the rod-shaped electrodes 471 and 472 by filling or purging the electrode protection pipes 451 and 452 with an inert gas such as nitrogen so as to suppress oxygen concentration therein to be sufficiently low.

Plasma generated according to the present embodiment will be referred to as remote plasma. The remote plasma means that a plasma treatment is performed by delivering plasma generated between electrodes to a surface of an object to be processed using the flow of a gas, etc. In the present embodiment, since the two rod-shaped electrodes 471 and 472 are accommodated in the buffer chamber 423, ions that cause damage to the wafers 200 are not likely to leak out of the buffer chamber 423 into the process chamber 201. Also, an electric field is generated to produce plasma such that the two rod-shaped electrodes 471 and 472 are encompassed by the electric field (i.e., the electrode protection pipes 451 and 452 in which the two rod-shaped electrodes 471 and 472 are accommodated, respectively, are encompassed by the electric field). An active species contained in the plasma is supplied toward the center of the wafers 200 from outer circumferences of the wafers 200 via the gas supply holes 425 of the buffer chamber 423. Also, when a longitudinal batch apparatus configured to pile up the wafers 200 in a stack such that main surfaces of the wafers 200 are disposed in parallel with a horizontal plane is used as in the present embodiment, the buffer chamber 423 is disposed on a location adjacent to an inner wall of the reaction tube 203, i.e., a location near a wafer 200 to be processed. Thus, the generated active species is likely not to be deactivated and to arrive at a surface of the wafer 200.

Referring to FIGS. 1 and 2, an exhaust port 230 is installed at a lower portion of the reaction tube 203. The exhaust port 230 is connected to an exhaust pipe 231. The plurality of gas supply holes 411 of the nozzle 410 and the exhaust port 230 are installed at opposite locations (on opposite sides at 180°) while having the wafers 200 therebetween. In this case, a source gas supplied from the plurality of gas supply holes 411 flows on a main surface of the wafer 200 to cross a direction of the exhaust pipe 231, and is likely to be evenly supplied to an entire surface of the wafer 200, thereby forming a more uniform film on the wafer 200.

As described above, in a gas supply method according to the present embodiment, a gas is transferred via the nozzles 410 and 420 and the buffer chamber 423 disposed in an arc-shaped space that is vertically long and defined by an inner wall of the reaction tube 203 and end portions of a plurality of stacked wafers 200, is first discharged into the reaction tube 203 near the wafers 200 via the plurality of gas supply holes 411, 421, and 425 that are open in the respective nozzles 410 and 420 and the buffer chamber 423, and a main flow of the gas in the reaction tube 203 is controlled to be in parallel with surfaces of the wafers 200, i.e., a horizontal direction. Accordingly, the gas may be evenly supplied to each of the wafers 200, and a thin film that is to be formed on each of the wafers 200 may have a uniform thickness. Also, the gas flowing on the surfaces of the wafers 200, i.e., a gas remaining after a reaction, flows in the direction of the exhaust port 230, i.e., the direction of the exhaust pipe 231. However, the direction in which the remaining gas flows may be appropriately determined by the location of the exhaust port 230 and is not limited to a vertical direction.

In the present embodiment, a plasma source that mainly includes the rod-shaped electrode 471, the rod-shaped electrode 472, the electrode protection pipe 451, and the electrode protection pipe 452 is used. The impedance matching unit 271 and the RF power source 270 may be further included in the plasma source.

Also, the plasma generation structure 429 that mainly includes the rod-shaped electrode 471, the rod-shaped electrode 472, the electrode protection pipe 451, the electrode protection pipe 452, the buffer chamber 423, and the gas supply holes 425 is installed to be linearly symmetrical with respect to a line passing the centers of the wafers 200 (center of the reaction tube 203). Thus, plasma is easily supplied onto the entire surfaces of the wafers 200 from the plasma generation structure 429, thereby enabling a film to be more evenly formed on the wafers 200.

Since the exhaust port 230 is also installed on the line passing the centers of the wafers 200 (center of the reaction tube 203), plasma is easily supplied onto the entire surfaces of the wafers 200, thereby enabling a film to be more evenly formed on the wafers 200. Also, because the plurality of gas supply holes 411 of the nozzle 410 are installed on the line passing the centers of the wafers 200 (center of the reaction tube 203), plasma is more easily supplied onto the entire surfaces of the wafers 200, thereby enabling a film to be more evenly formed on the wafers 200.

Referring back to FIGS. 1 and 2, the exhaust pipe 231 configured to exhaust an atmosphere in the process chamber 201 is connected to the exhaust port 230 below the reaction tube 203. A vacuum pump 246 serving as a vacuum-exhaust device is connected to the exhaust pipe 231 via a pressure sensor 245 serving as a pressure detector (pressure detection unit) configured to detect pressure in the process chamber 201 and an auto pressure controller (APC) valve 243 serving as a pressure adjustor (pressure adjustment unit), and is configured to perform vacuum-exhaust such that the pressure in the process chamber 201 is equal to a predetermined pressure (degree of vacuum). The exhaust pipe 232 at a downstream side of the vacuum pump 246 is connected to a waste gas processing device (not shown), etc. Also, the APC valve 243 is an opening/closing valve configured to perform or suspend vacuum-exhaust in the process chamber 201 by opening/closing the APC valve 243, and to adjust the pressure in the process chamber 201 by adjusting a conductance by controlling the degree of opening the APC valve 243. An exhaust system mainly includes the exhaust pipe 231, the APC valve 243, and the pressure sensor 245. The vacuum pump 246 may be further included in the exhaust system.

In the reaction tube 203, a temperature sensor 263 is installed as a temperature detector. The temperature sensor 263 is configured to control an amount of electric power to be supplied to the heater 207 based on temperature information detected by the temperature sensor 263, so that the temperature in the process chamber 201 may have a desired temperature distribution. The temperature sensor 263 has an L shape, is introduced while passing through a manifold 209, and is installed along an inner wall of the reaction tube 203.

The boat 217 is installed in a central region of the reaction tube 203. The boat 217 is configured to be moved upward/downward with respect to (or to be loaded into/unloaded from) the reaction tube 203 by the boat elevator 115. When the boat 217 is loaded into the reaction tube 203, a lower end portion of the reaction tube 203 is air-tightly sealed by the seal cap 219 via the O-ring 220. The boat 217 is supported by the boat support platform 218. In order to improve the uniformity of substrate processing, the boat rotation mechanism 267 is driven to rotate the boat 217 supported by the boat support platform 218.

Elements such as the mass flow controllers 312, 322, 512, and 522, the valves 314, 323, 513, 523, 612, 622, the APC valve 243, the vaporizer 315, a heating power source 250, the temperature sensor 263, the pressure sensor 245, the vacuum pump 246, the boat rotation mechanism 267, the boat elevator 115, and the RF power source 270 are connected to a controller 280. The controller 280 is configured to perform: flow rate control using the mass flow controller 312, 322, 512, or 522; an opening/closing operation using the valve 314, 323, 513, 523, 612, or 622; an opening/closing operation using the APC valve 243; pressure control using opening degree control based on pressure information obtained from the pressure sensor 245; a vaporization operation using the vaporizer 315; temperature control using adjustment of the amount of electric power to the heater 207 from the heating power source 250 based on temperature information obtained from the temperature sensor 263; control of RF power supplied from the RF power source 270; starting/suspending the vacuum pump 246; adjustment of a rotation speed of the boat 217 using the boat rotation mechanism 267; control of moving the boat 217 upward/downward using the boat elevator 115, etc.

As an example of the above configuration, a titanium (Ti)-containing source [titanium tetrachloride (TiCl$_4$), tetrakis (dimethylamino)titanium (TDMAT, Ti[N(CH$_3$)$_2$]$_4$), tetrakis (diethylamino)titanium (TDEAT, Ti[N(CH$_2$CH$_3$)$_2$]$_4$, etc.], a silicon (Si)-containing source [hexachlorodisilane (HCDS, Si$_2$Cl$_6$), dichlorosilane (DCS, SiH$_2$Cl$_2$), trichlorosilane (TCS, SiHCl$_3$), tris(dimethylamino) silane (TDMAS, (SiH(N (CH$_3$)$_2$)$_3$], or the like is introduced as a source gas in the gas supply pipe 310. In the gas supply pipe 320, ammonia (NH$_3$), nitrogen (N$_2$), nitrous oxide (N$_2$O), monomethyl hydrazine (CH$_6$N$_2$), or the like, which is a nitrogen (N)-containing gas, e.g., a nitriding source; or oxygen (O$_2$), vapor (H$_2$O), ozone (O$_3$), or the like, which is an oxygen (O)-containing gas, is introduced as a reactive gas.

Next, the reaction tube 203 according to an embodiment of the present invention will be described in detail.

Figure 3:
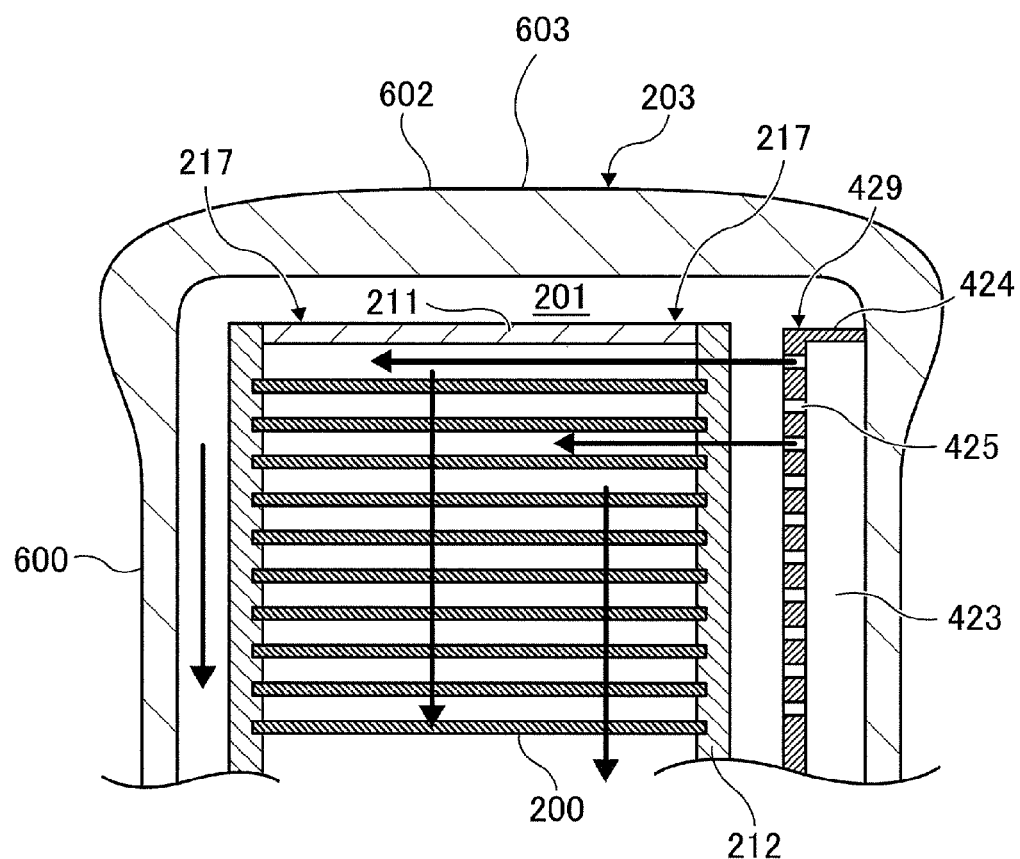
FIG. 3 is a longitudinal cross-sectional view of a top region of a reaction tube according to an embodiment of the present invention.

FIG. 3 illustrates a top region of the reaction tube 203 according to an embodiment of the present invention. The reaction tube 203 includes a cylindrical portion 600 having a cylindrical shape, and a ceiling portion 602 covering an upper portion of the cylindrical portion 600.

A top inner surface of the ceiling portion 602 is almost planar (flat). Thus, a gas supplied from the buffer chamber 423 via the gas supply holes 425 may be controlled to flow in a transverse direction (which is parallel with the wafers 200). Also, by forming an inner surface of the ceiling portion 602 in a flat shape, a gas may be suppressed from leaking upward, compared to a conventional dome-shaped reaction tube, thereby efficiently supplying the gas onto the wafer 200. Thus, a film may be evenly formed in a top region (upper region), a center region (central region), and a bottom region (lower region) of a wafer region, i.e., the film uniformity between surfaces of the wafers 200 is improved, thereby reducing the number of dummy wafers stacked on the boat 217.

Also, an external shape of the ceiling portion 602 is similar to a mushroom shape, and a maximum outer diameter of the ceiling portion 602 is greater than a maximum outer diameter of the cylindrical portion 600. By forming the ceiling portion 602 in the mushroom shape, the hardness of the upper portion of the reaction tube 203 may be increased.

Also, a top outer surface 603 of the ceiling portion 602 may be planar (flat), or may have a shape having a non-zero curvature (i.e., a dome shape).

Also, the height of an inner surface of the ceiling portion 602 may be less than or equal to the height of a convex portion of the external shape of the ceiling portion 602 (a portion of the ceiling portion 602, the outer diameter of which is greater than the outer diameter of the cylindrical portion 600).

Figure 4B:
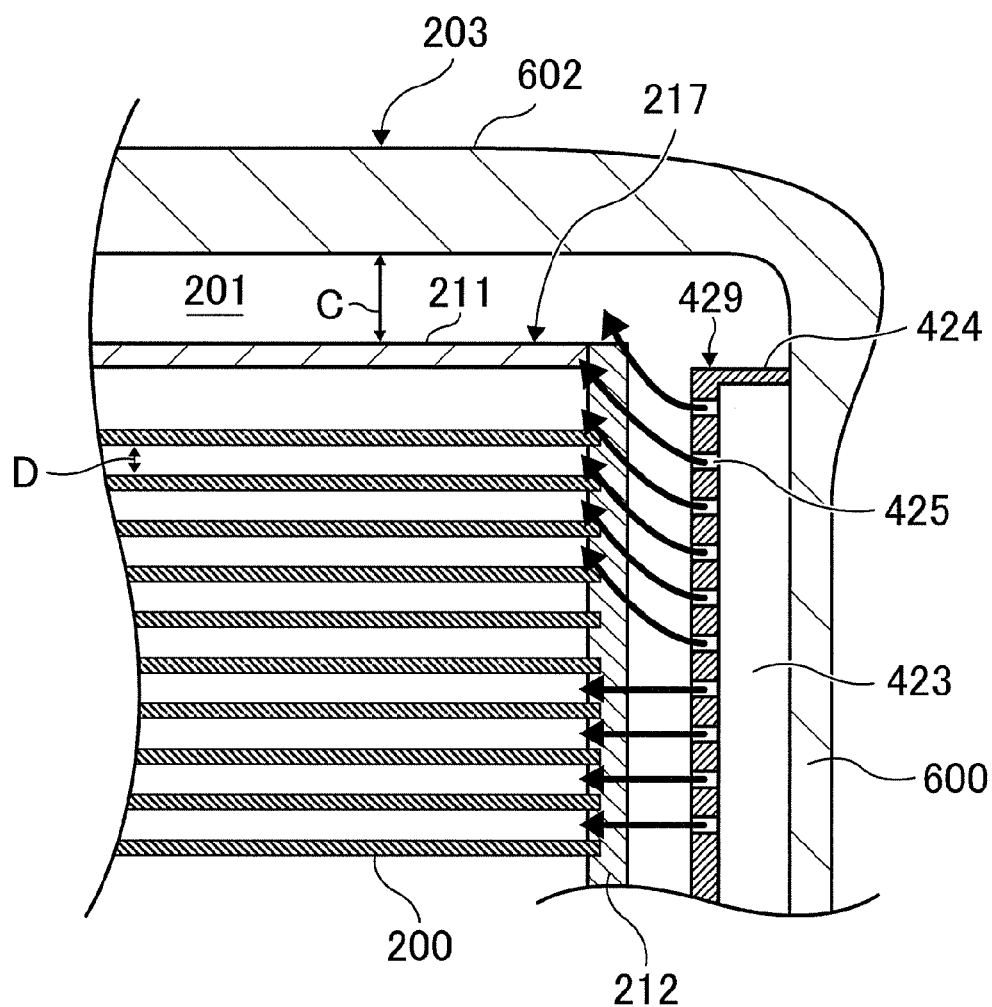

FIGS. 4A and 4B are diagrams illustrating the flow of a gas in the top region of the reaction tube 203. Specifically, FIG. 4A is a cross-sectional view of the reaction tube 203 according to an embodiment of the present invention, and FIG. 4B is a cross-sectional view of a reaction tube according to a comparative example of the present invention.

As illustrated in FIG. 4A, the distance B between an inner surface of the ceiling portion 602 and the ceiling plate 211 is preferably twice the distance D between adjacent wafers 200 (boat pitch) or less. When the distance B is twice the distance D or less, a gas supplied from the buffer chamber 423 is supplied in parallel with the wafers 200.

As illustrated in FIG. 4B, in the reaction tube 203 according to the comparative example, the distance C between the inner surface of the ceiling portion 602 and the ceiling plate 211 is greater than twice the distance D between adjacent wafers 200. In this case, a gas supplied from the buffer chamber 423 flows upward in the top region and is thus not evenly supplied onto the wafers 200. That is, steps are generated due to the buffer chamber 423 in the reaction tube 203 including the buffer chamber 423 (reaction tube configured to excite a gas using plasma), thereby causing non-uniformity between or within surfaces of the stacked wafers 200.

Thus, in the reaction tube 203 according to the present embodiment, an upper space of the ceiling plate 211 in which a gas remains is preferably reduced in size. Also, although a case in which the buffer chamber 423 is installed has been described in the present embodiment, the technical idea of the present embodiment may also be applied to a reaction tube in which the buffer chamber 423 is not installed.

Next, an example of a process of manufacturing a semiconductor device for manufacturing a large-scale integrated circuit (LSI), etc., using the substrate processing apparatus described above will be described. Also, in the following description, operations of elements of a substrate processing apparatus are controlled by the controller 280. Here, a thin film is formed by alternately supplying a plurality of types of process gases onto a wafer 200 without mixing the process gases. In this case, the thickness of the thin film that is to be formed may be controlled by adjusting the number of times that the process gases are supplied.

FIRST EMBODIMENT

An example of a process of forming a titanium nitride (TiN) film on a substrate using a substrate processing apparatus according to the first embodiment will now be described.

Figure 5:
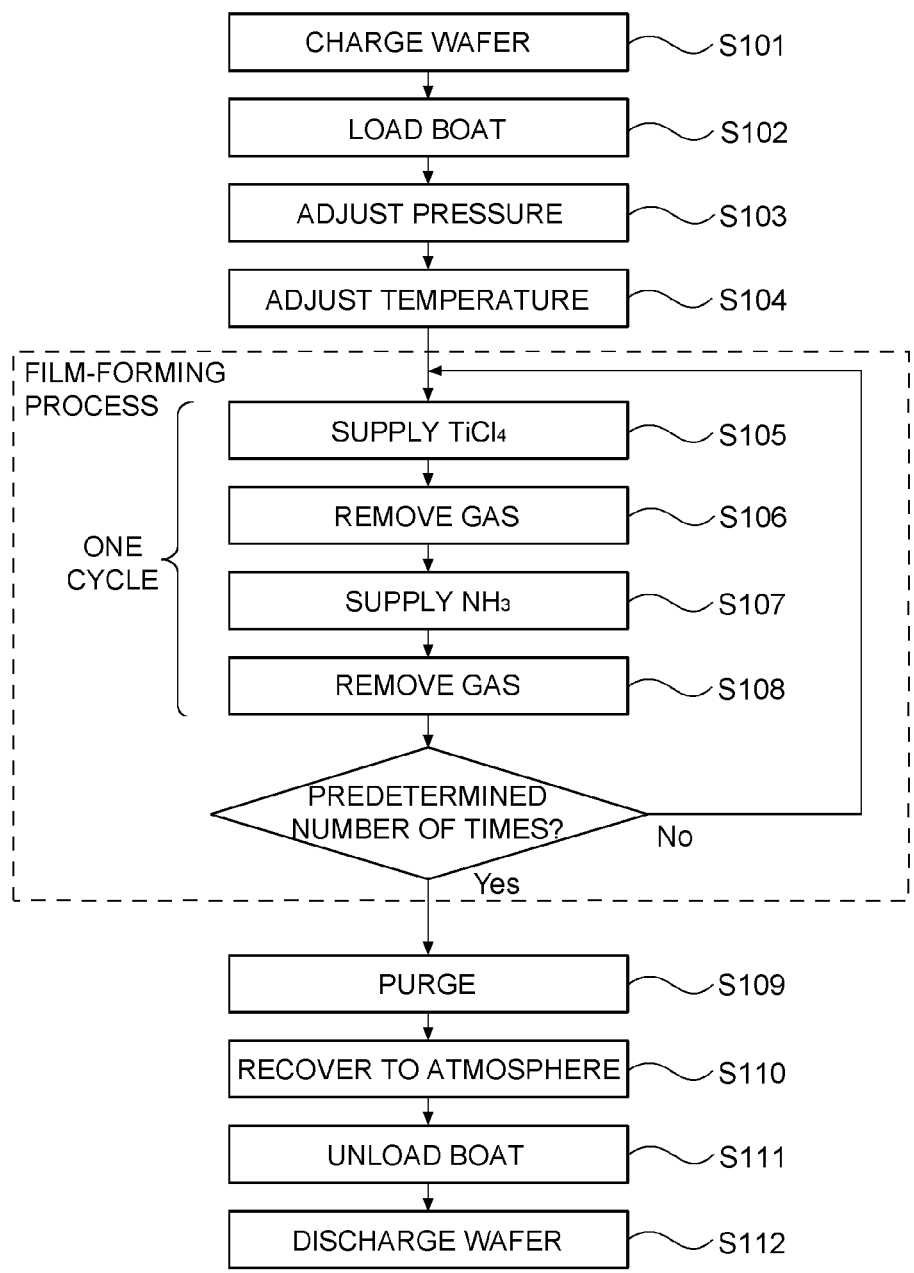
FIG. 5 is a flowchart illustrating a control method according to a first embodiment of the present invention.
Figure 6:
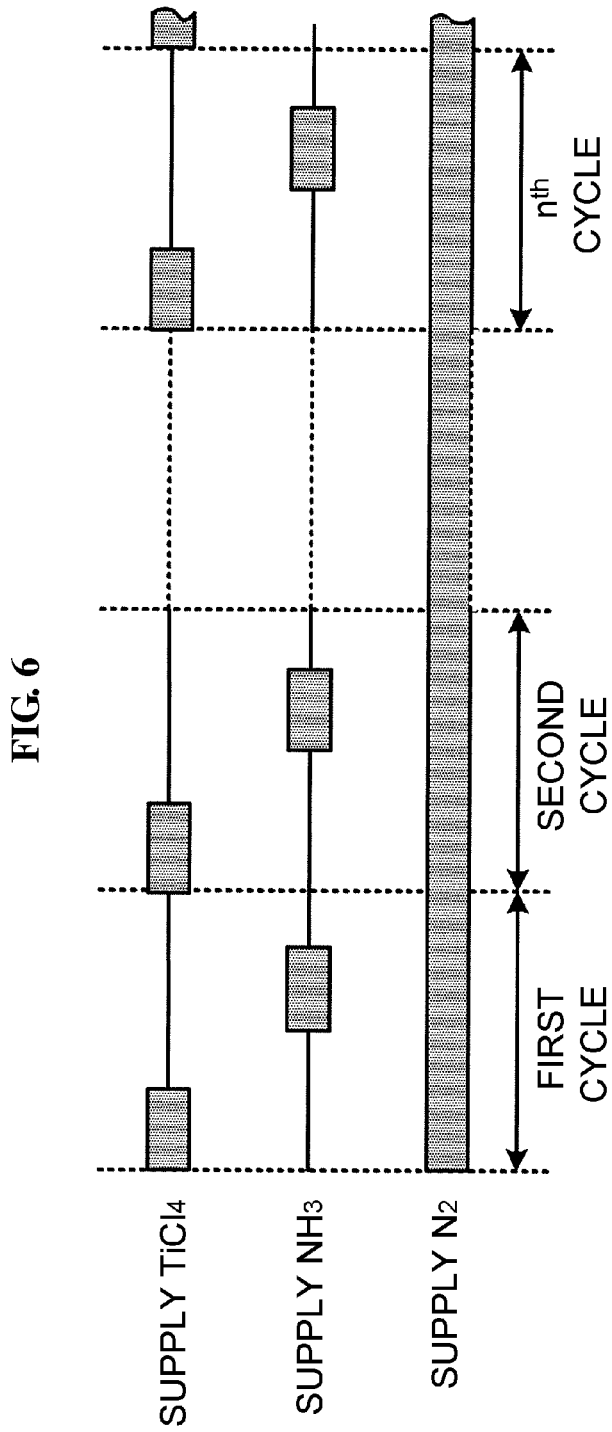
FIG. 6 is a timing chart illustrating a sequence of a film-forming process according to the first embodiment of the present invention.

Here, a process of forming the TiN film on a wafer 200 (surface of the wafer 200, an underlying film formed on the surface of the wafer 200, etc.), in which titanium (Ti) is used as a first element, nitrogen (N) is used as a second element, $TiCl_4$ which is a Ti-containing source is used as a source containing the first element, and $NH_3$ which is a N-containing gas is used as a reactive gas containing the second element will be described with reference to FIGS. 5 and 6 below. FIG. 5 is a flowchart illustrating a process of manufacturing a TiN film according to the first embodiment of the present invention. FIG. 6 is a timing chart illustrating the process of manufacturing the TiN film according to the first embodiment of the present invention.

Substrate Charging Process (Step S101)

A plurality of wafers 200 (e.g., one hundred wafers 200) are placed on the boat 217 (wafer charging).

Substrate Loading Process (Step S102)

Then, a furnace port shutter (not shown) is opened. The boat 217 supporting the plurality of wafers 200 is lifted by the boat elevator 115 and is then loaded into the process chamber 201 (boat loading). In this state, a lower end of the reaction tube 203 is sealed by the seal cap 219 via the O-ring 220. Then, the boat 217 is rotated by the boat rotation mechanism 267 to rotate the wafers 200.

Pressure Control Process (Step S103) & Temperature Control Process (Step S104)

Then, the APC valve 243 is opened to perform vacuum-absorption using the vacuum pump 246 such that the inside of the process chamber 201 may have a desired pressure (degree of vacuum). Then, the heating power source 250 configured to supply electric power to the heater 207 is controlled to heat the inside of the process chamber 201 to a temperature ranging from 200° C. to 600° C., e.g., to 300° C. When, the temperature of the wafer 200 reaches 300° C. and is stabilized, subsequent steps are sequentially performed while the inside of the process chamber 201 is maintained at 300° C. In this case, the pressure in the process chamber 201 is measured by the pressure sensor 245, and the degree of opening the APC valve 243 is feedback controlled based on the measured pressure (pressure control). Also, the inside of the process chamber 201 is heated to a desired temperature by the heater 207. In this case, the state of the supply of the electric power to the heater 207 from the heating power source 250 is feedback controlled based on temperature information detected by the temperature sensor 263, so that the inside of the process chamber 201 may have the desired temperature (temperature control).

Also, $TiCl_4$ gas is generated beforehand by vaporizing $TiCl_4$ which is a liquid source (preliminary vaporization), together with performing operations S101 to S104. Specifically, the $TiCl_4$ gas is generated beforehand by opening the valve 612 while the valve 314 is closed, and supplying the $TiCl_4$ gas into the vaporizer 315 by controlling the flow rate of the $TiCl_4$ gas using the mass flow controller 312. In this case, by opening the valve 612 while the vacuum pump 246 is operated and the valve 314 is closed, the $TiCl_4$ gas is not supplied into the process chamber 201 but bypasses the process chamber 201 to be exhausted beforehand. As described above, the $TiCl_4$ gas is generated beforehand so that the $TiCl_4$ gas may be stably supplied, and a flow path of the $TiCl_4$ gas is switched by switching between opening and closing of the valves 314 and 612. Accordingly, the supply of the $TiCl_4$ gas into the process chamber 201 may be stably and rapidly started and suspended.

Next, a TiN film-forming process in which the TiN film is formed on the wafer 200 by supplying the $TiCl_4$ gas and $NH_3$ into the process chamber 201 is performed. In the TiN film-forming process, the following four steps (steps S105 to S108) are sequentially performed.

TiN Film-Forming Process (Ti-Containing Gas Supply Process) (Step S105)

In the Ti-containing gas supply process (step S105), $TiCl_4$ gas is supplied as a Ti-containing gas into the process chamber 201 from the gas supply pipe 310 of the gas supply system 301 via the plurality of gas supply holes 411 of the nozzle 410. Specifically, $TiCl_4$ gas vaporized in the vaporizer 315 is started to be supplied from the gas supply pipe 310 into the process chamber 201 together with a carrier gas by closing the valve 612 and opening the valves 314 and 513. In this case, the pressure in the process chamber 201 is maintained at a pressure having a range of 10 Pa to 100 Pa, e.g., at 40 Pa, by adjusting the degree of opening the APC valve 243. The supply flow rate of the $TiCl_4$ may be in a range, for example, from 1 g/min to 10 g/min. The duration of supplying the $TiCl_4$ gas may be set to fall within a range, for example, from 1 to 10 seconds. When a predetermined time passes, the valve 314 is closed and the valve 610 is opened to suspend the supply of the $TiCl_4$ gas.

The $TiCl_4$ gas supplied into the process chamber 201 is supplied onto the wafer 200 and is exhausted from the exhaust pipe 231. In this case, only inert gases such as the $TiCl_4$ gas and $N_2$ gas remain in the process chamber 201, an N-containing gas such as $NH_3$ gas is not present in the process chamber 201, and a Ti-containing film is formed on the wafer 200.

When an inert gas such as $N_2$ is supplied by opening the carrier gas supply pipe 520 connected to the gas supply pipe 320 while the $TiCl_4$ gas is supplied into the process chamber 201, the $TiCl_4$ gas may be prevented from flowing into the gas supply pipe 320.

Gas Removal Process (Step S106)

After the valve 314 is closed and the supply of the $TiCl_4$ gas into the process chamber 201 is suspended, the APC valve 243 is opened to exhaust the process chamber 201 such that the pressure in the process chamber 201 is, for example, 10 Pa or less, and the $TiCl_4$ gas or byproducts remaining in the process chamber 201 are eliminated. In this case, when the inside of the process chamber 201 is purged by supplying an inert gas such as $N_2$ into the process chamber 201 from carrier gas supply pipes 510 and 520, the effect of eliminating remaining gases from the process chamber 201 may be further increased. After a predetermined time passes, the valves 513 and 523 are closed and the gas removal process (step S106) is completed.

In this case, gases remaining in the process chamber 201 need not be completely eliminated and the inside of the process chamber 201 need not be completely purged. When the amount of gases remaining in the process chamber 201 is very small, a nitrogen-containing gas supply process (step S107) which is a subsequent process is not badly influenced by the gases. In this case, the flow rate of the $N_2$ gas supplied into the process chamber 201 need not be high, and the purging of the inside of the process chamber 201 may be performed by supplying, for example, the amount of the $N_2$ gas corresponding to the volume of the reaction tube 203 (process chamber 201) without causing bad influences on the N-containing gas supply process (step S107). As described above, a purging duration may be reduced by not completely purging the inside of the process chamber 201, thereby improving the throughput. Also, the consumption of the $N_2$ gas may be suppressed to a minimum level.

Nitrogen-Containing Gas Supply Process (Step S107)

Next, $NH_3$ is supplied into the buffer chamber 423 from the gas supply pipe 320 of the gas supply system 302 via the gas supply holes 421 of the nozzle 420. In this case, when RF power is supplied between the rod-shaped electrodes 471 and 472 from the RF power source 270 via the impedance matching unit 271, NH$_3$ gas supplied into the buffer chamber 423 is plasma-excited, supplied as an active species from the gas supply holes 425 into the process chamber 201, and then exhausted from the gas exhaust pipe 231.

The flow rate of NH$_3$ is adjusted by the mass flow controller 322, and the adjusted NH$_3$ is supplied into the buffer chamber 423 via the gas supply pipe 320. Before NH$_3$ is supplied into the buffer chamber 423, the valve 323 is closed, the valve 622 is opened, and NH$_3$ is supplied beforehand to the vent line 620 via the valve 622. Then, when NH$_3$ is supplied into the buffer chamber 423, the valve 622 is closed and the valve 323 is opened to supply NH$_3$ to the gas supply pipe 320 at the downstream side of the valve 323, and the valve 523 is opened to supply a carrier gas (N$_2$) into the carrier gas supply pipe 520. The flow rate of the carrier gas (N$_2$) is adjusted by the mass flow controller 522. NH$_3$ is mixed with the carrier gas (N$_2$) at the downstream side of the valve 323, and the mixture gas is supplied into the buffer chamber 423 via the nozzle 420.

When NH$_3$ gas is supplied as an active species by plasma-exciting the NH$_3$ gas, the APC valve 243 is appropriately adjusted to set the pressure in the process chamber 201 to less than 200 Pa, e.g., to fall within a range of 10 to 200 Pa (preferably about 60 Pa). The supply flow rate of the NH$_3$ gas controlled by the mass flow controller 322 may be set to fall within a range of, for example, 1 to 10 slm. A duration for which the wafer 200 is exposed to the active species obtained by plasma-exciting the NH$_3$ gas, i.e., a gas supply time, may be set to be in a range, for example, of 1 to 60 seconds. The RF power applied between the rod-shaped electrodes 471 and 472 from the RF power source 270 is set to fall within a range of 50 to 1000 W, e.g., 400 W. Also, the inside of the process chamber 201 is maintained at 300° C. beforehand by controlling the heating power source 250 configured to supply electric power to the heater 207.

Also, if the APC valve 243 installed at the exhaust pipe 231 is closed to suspend vacuum-exhaust when the NH$_3$ gas is supplied as an active species by plasma-exciting the NH$_3$ gas, the active species obtained by plasma-exciting the NH$_3$ gas may be deactivated before the active species arrives at the wafer 200, and does not react with a surface of the wafer 200. Thus, when the NH$_3$ gas is supplied as an active species by plasma-exciting the NH$_3$ gas, the APC valve 243 is opened to exhaust the process furnace 202.

The NH$_3$ gas supplied into the process chamber 201 is supplied onto a Ti-containing layer on the wafer 200 and is then exhausted from the exhaust pipe 231. In this case, only inert gases such as the NH$_3$ gas and the N$_2$ gas remain in the process chamber 201 and a Ti-containing gas such as the TiCl$_4$ gas is not present in the process chamber 201. The NH$_3$ gas supplied into the process chamber 201 reacts with the Ti-containing layer formed on the wafer 200 to form a titanium nitride (TiN) layer.

At the same time, N$_2$ (an inert gas) may be supplied from the carrier gas supply pipe 510 connected to a portion of the gas supply pipe 310 by opening the valve 513, thereby preventing NH$_3$ from flowing into the nozzle 410 or the gas supply pipe 310. Also, the flow rate of N$_2$ (an inert gas) controlled by the mass flow controller 512 may be low, since N$_2$ (an inert gas) is supplied to prevent the flow of NH$_3$ into the nozzle 410 or the gas supply pipe 310.

Gas Removal Process (S108)

After the valve 323 is closed and the supply of the NH$_3$ gas into the process chamber 201 is suspended, the APC valve 243 is opened to exhaust the process chamber 201 such that the pressure in the process chamber 201 is 10 Pa or less, and the NH$_3$ gas or byproducts remaining in the process chamber 201 are eliminated. In this case, when the inside of the process chamber 201 is purged by supplying an inert gas such as N$_2$ into the process chamber 201 from the carrier gas supply pipes 510 and 520, the effect of eliminating gases remaining in the process chamber 201 may be further increased. After a predetermined time passes, the valves 513 and 523 are closed and the gas removal process (step S108) is completed.

In this case, the gases remaining in the process chamber 201 need not be completely eliminated and the inside of the process chamber 201 need not be completely purged. When the amount of gases remaining in the process chamber 201 is very small, the Ti-containing gas supply process (step S105) which is a subsequent process is not badly influenced by the gases. In this case, the flow rate of the N$_2$ gas supplied into the process chamber 201 need not be high, and the inside of the process chamber 201 may be purged by supplying the N$_2$ gas, the amount of which corresponds to, for example, the volume of the reaction tube 203 (process chamber 201) without causing bad influences on the Ti-containing gas supply process (step S105). As described above, a purging duration may be reduced by not completely purging the inside of the process chamber 201, thereby improving the throughput. Also, the consumption of the N$_2$ gas may be suppressed to a minimum level.

A TiN film is formed on the wafer 200 to a predetermined thickness by performing one cycle including steps S105 to S108 described above at least once.

Purging Process (S109)

After the TiN film is formed to the predetermined thickness, the process chamber 201 is purged with an inert gas such as N$_2$ by supplying the inert gas into the process chamber 201 and then exhausting the inert gas (gas purging). For the gas purging, it is preferable to repeatedly perform supplying of an inert gas such as N$_2$ into the process chamber 201 by removing remaining gases, closing the APC valve 243, and opening the valves 513 and 523; suspending the supplying of the inert gas such as N$_2$ into the process chamber 201 by closing the valves 513 and 523; and performing vacuum-absorption in the process chamber 201 by opening the APC valve 243.

Atmosphere Recovery Process (Step S110)

Then, the boat rotation mechanism 267 is stopped to suspend the rotation of the boat 217. Then, the valves 513 and 523 are opened to substitute the inert gas such as N$_2$ for an atmosphere in the process chamber 201 (inert gas substitution), and the pressure in the process chamber 201 is recovered to a normal pressure (atmosphere recovery).

Substrate Unloading Process (Step S111) & Substrate Discharging Process (Step S112)

Then, the seal cap 219 is moved downward by the boat elevator 115 to open the lower end of the reaction tube 203, and the processed wafer 200 is unloaded to the outside of the process chamber 201 from the lower end of the reaction tube 203 while the processed wafer 200 is supported by the boat 217 (boat unloading). Then, the lower end of the reaction tube 203 is closed with a furnace port shutter 147. Then, the vacuum pump 246 is stopped. Then, the processed wafer 200 is fetched out by the boat 217 (wafer discharging). Accordingly, a one-time film-forming process (batch processing) is completed.

SECOND EMBODIMENT

An example of a process of forming a silicon oxide (SiO$_2$) film on a substrate using a substrate processing apparatus according to the present embodiment will now be described.

Figure 7:
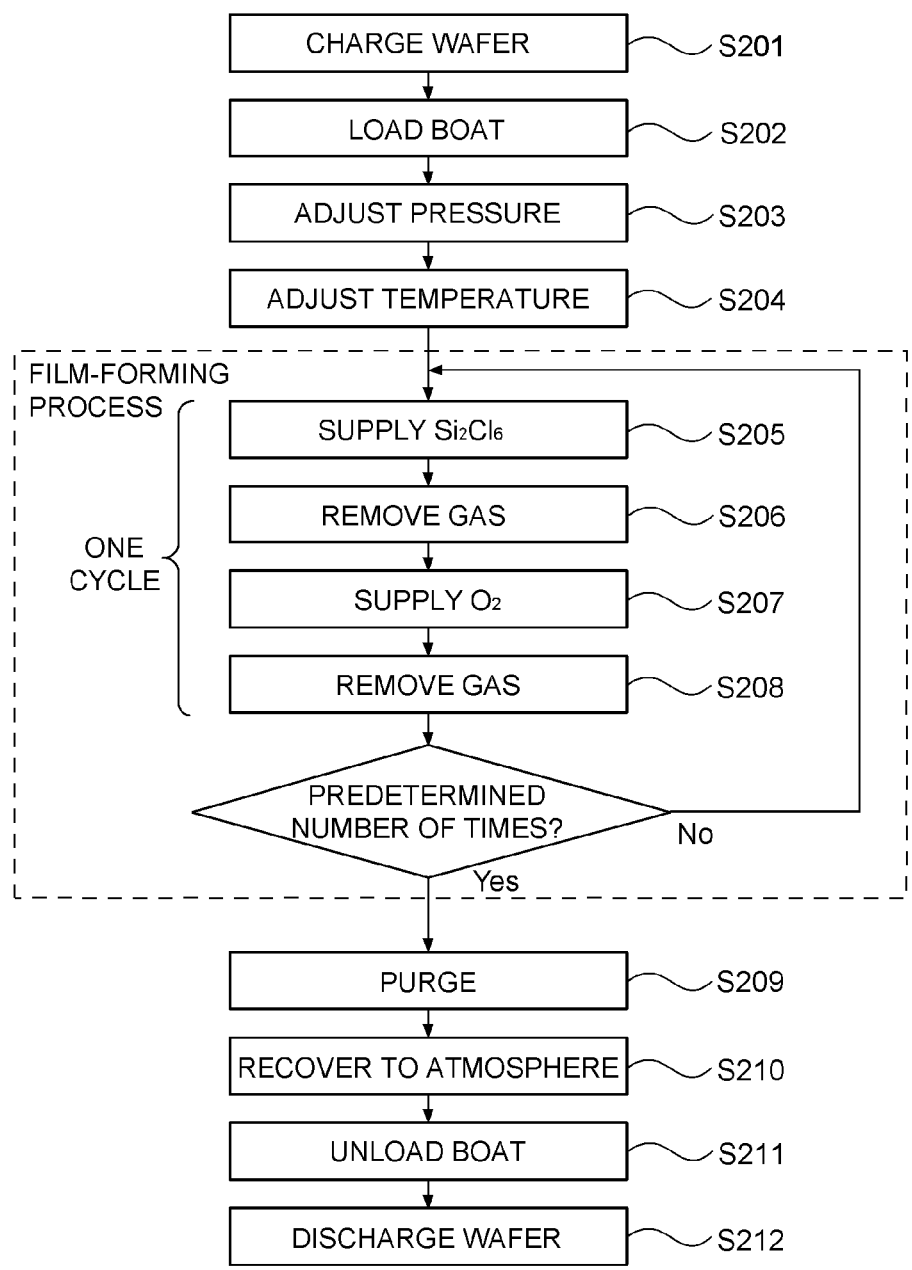
FIG. 7 is a flowchart illustrating a control method according to a second embodiment of the present invention.
Figure 9A:
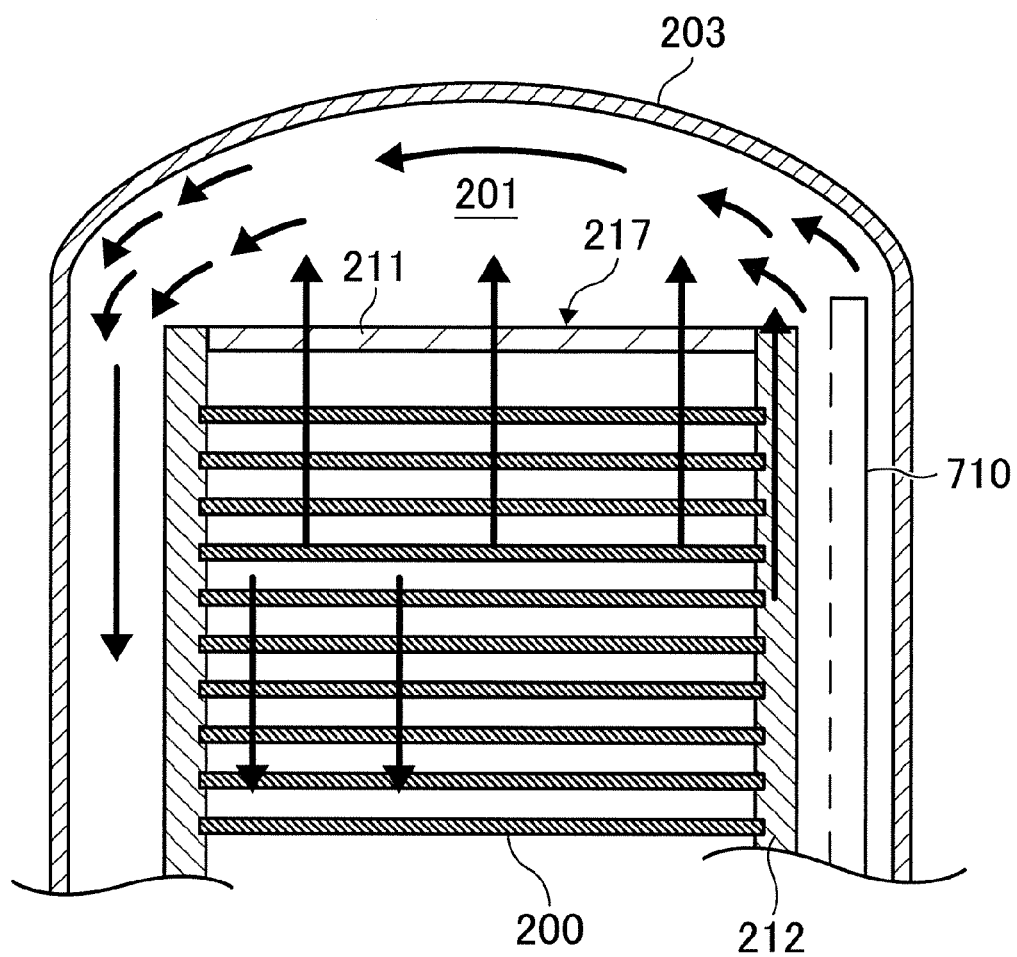
Figure 9B:
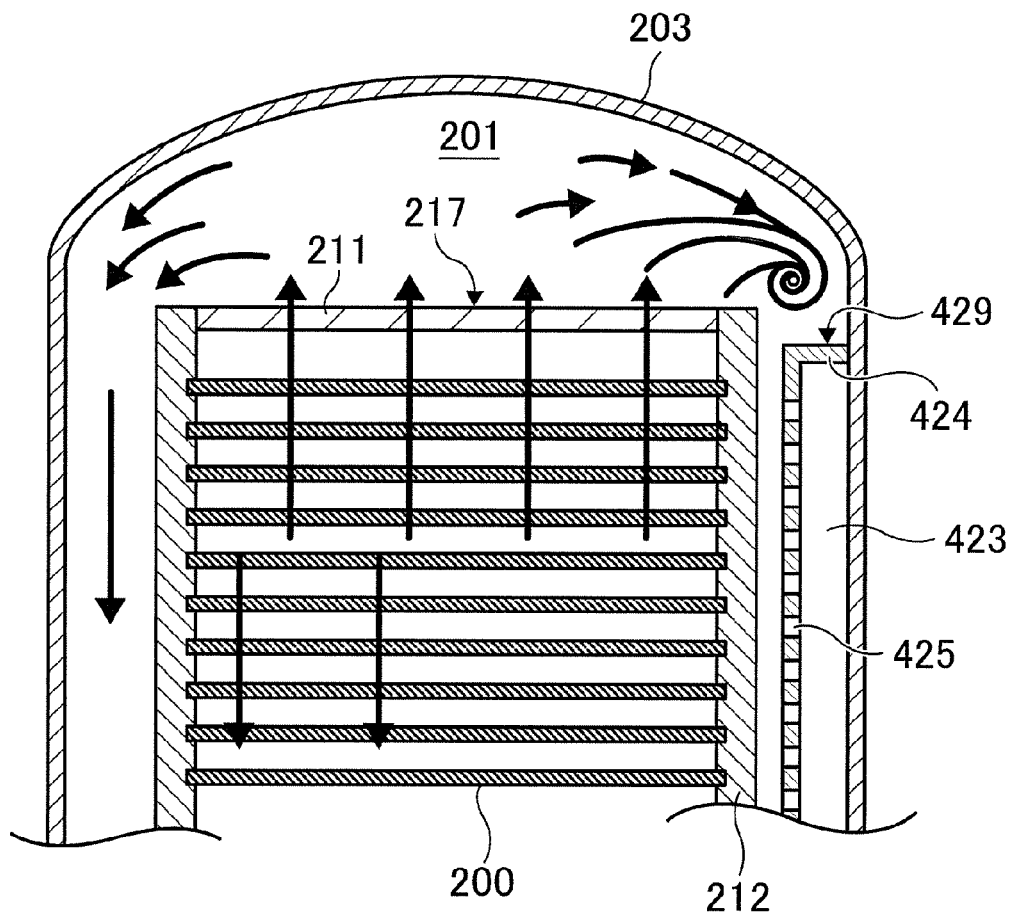

Here, a silicon oxide (SiO$_2$) film is formed on a wafer 200 (surface of the wafer 200, an underlying film formed on the surface of the wafer 200, etc.), in which silicon (Si) is used as a first element, oxygen (O) is used as a second element, hexachlorodisilane ($Si_2Cl_6$) which is a silicon-containing source is used as a source containing the first element, and oxygen ($O_2$) which is an oxygen-containing gas is used as a source containing the second element. The other configurations of the second embodiment are the same as those of the first embodiment described above. Main differences between the first and second embodiments will be described with reference to FIGS. 7 and 8 below. FIG. 7 is a flowchart illustrating a process of forming a $SiO_2$ film according to the second embodiment of the present invention. FIG. 8 is a timing chart illustrating the process of forming a $SiO_2$ film according to the second embodiment of the present invention. Also, a substrate processing process according to the second embodiment is performed using the process furnace 202 of the FIGS. 1 and 2. Operations of the elements of the process furnace 202 are controlled by the controller 280.

Substrate Charging Process (Step S201) to Temperature Raising Process (Step S204)

A substrate charging process (step S201), a substrate loading process (step S202), a pressure adjustment process (step S203), and a temperature adjustment process (step S204) are performed in a sequence similar to the sequence of performing the operations S101 to S104 according to the first embodiment described above.

Next, a $SiO_2$ film-forming process of forming the $SiO_2$ film on the wafer 200 is performed by supplying $Si_2Cl_6$ gas and $O_2$ into the process chamber 201. In the $SiO_2$ film-forming process, the following four steps (steps S205 to S208) are sequentially performed.

$SiO_2$ Film-Forming Process: Silicon-Containing Gas Supply Process (Step S205)

In the silicon-containing gas supply process (step S205), $Si_2Cl_6$ gas which is a silicon-containing gas is supplied into the process chamber 201 through the gas supply pipe 310 of the gas supply system 301 via the plurality of gas supply holes 411 of the nozzle 410. Specifically, the $Si_2Cl_6$ gas vaporized by the vaporizer 315 is started to be supplied into the process chamber 201 together with a carrier gas via the gas supply pipe 310 by closing the valve 612 and opening the valves 314 and 513. In this case, the degree to which the APC valve 243 is opened is adjusted to maintain the pressure in the process chamber 201 within a range of 10 Pa to 200 Pa, e.g., at 50 Pa. The supply flow rate of the $Si_2Cl_6$ gas is set to fall within a range, for example, of 0.1 g/min to 0.5 g/min. A duration of supplying the $Si_2Cl_6$ gas is set to fall within a range, for example, of 1 to 10 seconds. When a predetermined time passes, the valve 314 is closed and the valve 610 is opened to suspend the supply of the $Si_2Cl_6$ gas.

The $Si_2Cl_6$ gas supplied into the process chamber 201 is supplied onto the wafer 200 and is then exhausted from the exhaust pipe 231. In this case, only inert gases such as the $Si_2Cl_6$ gas and the $N_2$ gas remain in the process chamber 201, an oxygen-containing gas such as $O_2$ gas is not present in the process chamber 201, and a silicon-containing layer is formed on the wafer 200.

While the $Si_2Cl_6$ gas is supplied into the process chamber 201, when the carrier gas supply pipe 520 connected to the gas supply pipe 320 is opened to supply an inert gas such as $N_2$, the $Si_2Cl_6$ gas may be prevented from flowing into the gas supply pipe 320.

Gas Removal Process (Step S206)

After the valve 314 is closed and the supply of the $Si_2Cl_6$ gas into the process chamber 201 is suspended, the APC valve 243 is opened to exhaust the process chamber 201 such that the pressure in the process chamber 201 is, for example, 10 Pa or less, and the $Si_2Cl_6$ gas or byproducts remaining in the process chamber 201 are eliminated. In this case, when an inert gas such as $N_2$ is supplied into the process chamber 201 via the respective carrier gas supply pipes 510 and 520 to purge the inside of the process chamber 201 with the inert gas, the effect of eliminating the gases remaining in the process chamber 201 may be further increased. After a predetermined time passes, the valves 513 and 523 are closed and the gas removal process (step S206) is completed.

Oxygen-Containing Gas Supply Process (Step S207)

Next, $O_2$ gas is supplied into the buffer chamber 423 from the gas supply pipe 320 of the gas supply system 302 via the gas supply holes 421 of the nozzle 420. In this case, the $O_2$ gas supplied into the buffer chamber 423 is plasma-excited to form an active species by applying RF power between the rod-shaped electrodes 471 and 472 by the RF power source 270 via the impedance matching unit 271, and is exhausted via the gas exhaust pipe 231 while being supplied as the active species into the process chamber 201 via the gas supply holes 425.

The flow rate of the $O_2$ gas is adjusted by the mass flow controller 322 and the adjusted $O_2$ gas is supplied into the buffer chamber 423 via the gas supply pipe 320. Before the $O_2$ gas is supplied into the buffer chamber 423, the valve 323 is closed, the valve 622 is opened, and the $O_2$ gas is supplied beforehand to the vent line 620 via the valve 622. Then, when the $O_2$ gas is supplied into the buffer chamber 423, the valve 622 is closed, the valve 323 is opened, the $O_2$ gas is supplied into the gas supply pipe 320 at a downstream side of the valve 323, and the valve 523 is opened to supply a carrier gas ($N_2$) via the carrier gas supply pipe 520. The flow rate of the carrier gas ($N_2$) is adjusted by the mass flow controller 522. The $O_2$ gas is mixed with the carrier gas ($N_2$) at the downstream side of the valve 323, and the mixture gas is supplied into the buffer chamber 423 via the nozzle 420.

When the $O_2$ gas is supplied as an active species by plasma-exciting the $O_2$ gas, the APC valve 243 is appropriately adjusted to set the pressure in the process chamber 201 to less than 200 Pa, e.g., to fall within a range of, for example, 10 to 200 Pa (preferably about 50 Pa). The supply flow rate of the $O_2$ gas controlled by the mass flow controller 322 is set to fall within a range, for example, of 1 to 10 slm. A duration for which the wafer 200 is exposed to the active species obtained by plasma-exciting the $O_2$ gas, i.e., a gas supply time, is set to fall within a range, for example, of 1 to 10 seconds. Also, the RF power applied between the rod-shaped electrodes 471 and 472 from the RF power source 270 is set to fall within a range, for example, of 50 W to 1000 W, e.g., 400 W. Also, the inside of the process chamber 201 is maintained beforehand at 150° C. by controlling the heating power source 250 configured to supply electric power to the heater 207.

Also, if the APC valve 243 installed at the exhaust pipe 231 is closed and vacuum-exhaust is suspended when the $O_2$ gas is supplied as the active species by plasma-exciting the $O_2$ gas, the active species obtained by plasma-exciting the $O_2$ gas is deactivated before the active species arrives at the wafer 200, thereby preventing the active species from reacting with a surface of the wafer 200. Thus, when the $O_2$ gas is supplied as the active species by plasma-exciting the $O_2$ gas, the APC valve 243 is opened to exhaust the process furnace 202.

The $O_2$ gas supplied into the process chamber 201 is supplied to the silicon-containing layer on the wafer 200 and is then exhausted via the exhaust pipe 231. In this case, only inert gases such as the $O_2$ gas and the $N_2$ gas remain in the process chamber 201 and a silicon-containing gas such as the $Si_2Cl_6$ gas is not present in the process chamber 201. The $O_2$ gas supplied into the process chamber 201 reacts with the silicon-containing layer on the wafer 200 to form a silicon oxide ($SiO_2$) layer.

At the same time, $N_2$ (an inert gas) is supplied from the carrier gas supply pipe 510 connected to a portion of the gas supply pipe 310 by opening the valve 513, thereby preventing the $O_2$ gas from flowing into the nozzle 410 or the gas supply pipe 310. The flow rate of the $N_2$ (an inert gas) controlled by the mass flow controller 512 may be low since $N_2$ (an inert gas) is supplied to prevent the $O_2$ gas from flowing into the nozzle 410 or the gas supply pipe 310.

Gas Removal Process (Step S208)

After the valve 323 is closed and the supply of the $O_2$ gas into the process chamber 201 is suspended, the APC valve 243 is opened to exhaust the process chamber 201 such that the pressure in the process chamber 201 is, for example, 10 Pa or less, and the $O_2$ gas or byproducts remaining in the process chamber 201 are eliminated. In this case, when the inside of the process chamber 201 is purged by supplying an inert gas such as $N_2$ into the process chamber 201 via the carrier gas supply pipes 510 and 520, an effect of eliminating the gases remaining in the process chamber 201 may be more significantly increased. After a predetermined time passes, the valves 513 and 523 are closed and the gas removal process (step S208) is completed.

A $SiO_2$ film is formed on the wafer 200 to a predetermined thickness by performing one cycle including steps S205 to S208 at least once.

Purging Process (Step S209) to Substrate Discharging Process (Step S212)

The purging process (step S209), an atmosphere recovery process (step S210), a substrate unloading process (step S211), and a substrate discharging process (step S212) are performed in a sequence similar to the sequence in which steps S109 to S112 according to the first embodiment are performed.

Although a case in which a TiN film is formed on a substrate and a case in which a $SiO_2$ film is formed on a substrate have been described above, the present invention is not limited thereto and may also be applied to various other films such as a silicon nitride ($Si_3N_4$) film, a hafnium oxide ($HfO_2$) film, a zirconium oxide ($ZrO_2$) film, an aluminum oxide ($Al_2O_3$) film, or a 3-component film such as a titanium aluminum nitride (TiAlN) film, a titanium aluminum oxide (TiAlO) film, a hafnium aluminate (HfAlO) film, a zirconium aluminate (ZrAlO) film, etc.

According to the present invention, a reaction tube, a substrate processing apparatus and a semiconductor device manufacturing method capable of suppressing non-uniformity of gas distribution in a top region to improve the flow of the gas and film uniformity within or between substrate surfaces are provided.

Additional Exemplary Embodiments of the Present Invention

Additional exemplary embodiments of the present invention will now be described.

Supplementary Note 1

According to an aspect of the present invention, there is provided A reaction tube having a cylindrical shape and accommodating a plurality of substrates stacked therein, the reaction tube including: a cylindrical portion; and a ceiling portion covering an upper end portion of the cylindrical portion and having a substantially flat top inner surface, wherein a thickness of a sidewall of the ceiling portion is greater than that of a sidewall of the cylindrical portion.

Supplementary Note 2

It is preferable that the reaction tube further includes a process chamber configured to process the plurality of substrates in the reaction tube; and a buffer chamber partitioned from the process chamber to accommodate an electrode therein.

Supplementary Note 3

According to another aspect of the present invention, there is provided substrate a processing apparatus including: a reaction tube having a cylindrical shape and accommodating a plurality of substrates stacked therein, the reaction tube including: a process chamber configured to process the plurality of substrates in the reaction tube; a cylindrical portion; and a ceiling portion covering an upper portion of the cylindrical portion and having a substantially flat top inner surface, a thickness of a sidewall of the ceiling portion being greater than that of a sidewall of the cylindrical portion; a process gas supply system including a nozzle disposed in the process chamber along a stacking direction of the plurality of substrates, and configured to supply a process gas into the process chamber via the nozzle; and a control unit configured to control the process gas supply system to supply the process gas into the process chamber so as to process the plurality of substrates.

Supplementary Note 4

According to another aspect of the present invention, there is provided a substrate processing apparatus including a reaction tube having a cylindrical shape and accommodating a plurality of substrates stacked therein, the reaction tube including a process chamber configured to process the plurality of substrates in the reaction tube, and a buffer chamber partitioned from the process chamber; a process gas supply system configured to supply a process gas into the buffer chamber, a plasma generator including an electrode in the buffer chamber, and a control unit configured to control the process gas supply system and the plasma generator to process the plurality of substrates by plasma-exciting the process gas and supplying the plasma-excited process gas into the process chamber by applying a voltage to the electrode. The reaction tube includes a cylindrical portion; and a ceiling portion configured to cover an upper portion of the cylindrical portion and having a substantially flat top inner surface. A thickness of a sidewall of the ceiling portion is greater than that of a sidewall of the cylindrical portion.

Supplementary Note 5

It is preferable that the substrate processing apparatus further includes a substrate retaining member accommodating the plurality of substrates in the reaction tube by retaining the plurality of substrates stacked at predetermined intervals. The distance between an inner surface of the ceiling portion of the reaction tube and a top surface of the substrate retaining member is smaller than or equal to twice a distance between adjacent substrates among the plurality of stacked substrates.

Supplementary Note 6

It is preferable that a top outer surface of the ceiling portion is flat.

Supplementary Note 7

It is preferable that a curvature of a top outer surface of the ceiling portion is non-zero.

Supplementary Note 8

According to another aspect of the present invention, there is provided a method of manufacturing a semiconductor device, the method including: (a) loading a plurality of substrates into a reaction tube, the reaction tube including a cylindrical portion and a ceiling portion covering an upper end portion of the cylindrical portion wherein the ceiling portion has a substantially flat top inner surface, and a thickness of a sidewall of the ceiling portion being greater than that of a sidewall of the cylindrical portion; (b) processing the plurality of substrates by supplying a process gas into the reaction tube; and (c) unloading the plurality of substrates from the reaction tube.

Supplementary Note 9

It is preferable that the ceiling portion is flat.

Supplementary Note 10

It is preferable that a top outer surface of the ceiling portion is larger than a top outer surface of the cylindrical portion, an inner side surface of the ceiling portion has the same shape as the cylindrical portion, and the thickness of the ceiling portion is greater than that of the cylindrical portion.

What is claimed is:

1. A reaction tube to accommodate a plurality of substrates stacked therein, the reaction tube comprising:
   a hollow cylindrical portion; and
   a ceiling portion covering an upper end portion of the cylindrical portion to form a cylindrical process chamber, the ceiling portion having a substantially flat top inner surface that terminates the cylindrical process chamber and an external diameter that is greater than an outer diameter of the cylindrical portion, wherein a thickness of a sidewall of the ceiling portion is greater than that of a sidewall of the cylindrical portion and wherein the process chamber is terminated by the flat top inner surface of the ceiling portion where the outer diameter of the ceiling portion is greater than the outer diameter of the cylindrical portion.

2. The reaction tube according to claim 1, wherein a curvature of an outer connecting surface between the cylindrical portion and the ceiling portion is non-zero.

3. The reaction tube according to claim 1, further comprising:
   a buffer chamber partitioned from the process chamber to accommodate an electrode therein.

4. The reaction tube according to claim 1, wherein the inner diameter of the process chamber is substantially constant in both the ceiling portion and the cylindrical portion.

5. The reaction tube according to claim 1, wherein a top outer surface of the ceiling portion is substantially flat.

6. The reaction tube according to claim 1, wherein the ceiling portion is mushroom-shaped.

7. A substrate processing apparatus comprising:
   a reaction tube to accommodate a plurality of substrates stacked therein, the reaction tube comprising:
      a hollow cylindrical portion; and
      a ceiling portion covering an upper portion of the cylindrical portion to form a cylindrical process chamber in the reaction tube, the ceiling portion having a substantially flat top inner surface that terminates the cylindrical process chamber and an external diameter that is greater than an outer diameter of the cylindrical portion, a thickness of a sidewall of the ceiling portion being greater than that of a sidewall of the cylindrical portion, wherein the process chamber is terminated by the flat top inner surface of the ceiling portion where the outer diameter of the ceiling portion is greater than the outer diameter of the cylindrical portion;
   a process gas supply system including a nozzle disposed in the process chamber along a stacking direction of the plurality of substrates, and configured to supply a process gas into the process chamber via the nozzle; and
   a control unit configured to control the process gas supply system to supply the process gas into the process chamber so as to process the plurality of substrates.

8. The substrate processing apparatus according to claim 7, wherein the reaction tube further comprises a buffer chamber partitioned from the process chamber to accommodate an electrode therein.

9. The substrate processing apparatus according to claim 7, wherein the inner diameter of the process chamber is substantially constant in both the ceiling portion and the cylindrical portion.

10. The reaction tube according to claim 7, wherein a curvature of a connecting surface between the cylindrical portion and the ceiling portion is non-zero.

11. The reaction tube according to claim 7, wherein a top outer surface of the ceiling portion is substantially flat.

12. The reaction tube according to claim 7, further comprising: a substrate retaining member accommodating the plurality of substrates in the reaction tube, wherein a distance between the top inner surface of the ceiling portion and a top surface of the substrate retaining member is equal to or smaller than two times a distance between adjacent substrates among the plurality of substrates.

13. A substrate processing apparatus comprising:
   a reaction tube having a cylindrical shape and accommodating a plurality of substrates stacked therein, the reaction tube comprising:
      a cylindrical portion; and
      a ceiling portion covering an upper portion of the cylindrical portion wherein an outer diameter of the ceiling portion is greater than an outer diameter of the cylindrical portion and an outer connecting surface between the cylindrical portion and the ceiling portion is of non-zero curvature;
   a process chamber defined in the reaction tube and configured to process the plurality of substrates therein; and
   a process gas supply system configured to supply a process gas into the process chamber.

* * * * *